United States Patent [19]

Sun et al.

[11] Patent Number: 5,239,181
[45] Date of Patent: Aug. 24, 1993

[54] BRIDGE TYPE OPTOELECTRONIC SAMPLE AND HOLD CIRCUIT

[75] Inventors: Chen-Kuo Sun, La Jolla, Calif.; Chao C. Wu, Chung Li, Taiwan; Ching T. Chang, San Diego, Calif.; Paul K. Lai Yu, San Diego, Calif.; William H. McKnight, San Diego, Calif.

[73] Assignee: The United States of America as represented by the Secretary of the Navy, Washington, D.C.

[21] Appl. No.: 636,808

[22] Filed: Dec. 31, 1990

[51] Int. Cl.⁵ .............................................. G02B 27/00
[52] U.S. Cl. ..................................... 250/551; 307/353
[58] Field of Search ............... 250/551, 214; 307/311, 307/353

[56] References Cited

U.S. PATENT DOCUMENTS

| | | | |
|---|---|---|---|
| 4,275,307 | 6/1981 | Struger et al. | 250/551 |
| 4,546,249 | 10/1985 | Whitehouse et al. | 250/227 |
| 4,659,945 | 4/1987 | Metz | 307/353 |
| 4,885,545 | 12/1989 | Sanielevici | 307/262 |
| 4,950,076 | 8/1990 | Jarrett | 250/342 |

OTHER PUBLICATIONS

J. R. Gray et al., "A Precision Sample and Hold Circuit with Sub Nanosecond Switching", vol. CT-11, pp. 389-396, 1964.
IEEE Transactions Circuit Theory & Appl. Phys. lett. vol. 49, pp. 681-683, 1986.
E. A. Chauchard et al., "Repetitive Semiconductor Opening Switch and Application to Short Pulse Generation", Laser and Particle Beams vol. 17, pt3, pp. 615-626, 1989.
A. J. Taylor et al., "Timing Jitter in Mode-lock and Gain Switched InGaAsP Injection Lasers", Applied Phys. Lett. vol. 49, pp. 681-683, 1986.
D. J. Albares et al., "Optoelectronics Time Division Multiplexing", vol. 23, pp. 327-328, 1987—Electronics letter.
S. J. Wojtczuk et al., "Comparative Study of Easily Integratable Photodetectors", vol. LT-5, No. 10 pp. 1365-1370, 1987—J. Lightware Technology.
K. Poulton et al., "A2-GHZ HBT Sample and Hold", GaAsIC Symposium pp. 199-202, 1988.
K. Poulton et al., "A GHZ 6 bit ADC System", IEEE J. Solid-State Circuits, vol. SC-22 pp. 962-970, 1987.
D. H. Auston, "Picosecond Optoelectronic Switching and Gating in Silicon", Applied Phys. lett., vol. 26, pp. 101-103, 1975.
I. Diadiuk et al., "High Speed Optoelectronic Trade and Hold Circuits in Hybrid Signal Processors for Wideband Radar" pp. 207-211, 1985.

*Primary Examiner*—David C. Nelms
*Assistant Examiner*—T. Davenport
*Attorney, Agent, or Firm*—Harvey Fendelman; Thomas Glenn Keough

[57] ABSTRACT

A novel bridge type optoelectronic (OE) sample and hold circuit based upon current steering demonstrates a clear superiority in performance with respect to a direct OE sample and hold circuit. The bridge type OE sample and hold circuit permits a high-speed signal to be sampled with high accuracy to offer high charging capability, commanding signal isolation, reduced time jitter and reduced holding charge leakage which are distinct advantages over conventional electronic sample and hold circuits.

6 Claims, 4 Drawing Sheets

BRIDGE TYPE OPTOELECTRONIC SAMPLE AND HOLD CIRCUIT

STATEMENT OF GOVERNMENT INTEREST

The invention described herein may be manufactured and used by or for the Government of the United States of America for governmental purposes without the payment of any royalties thereon or therefor.

BACKGROUND OF THE INVENTION

For many signal processing applications, a high-speed sample and hold circuit plays an important role in converting incoming analog signals into quantized forms which are convenient for further processing and transmission. Conventional electronic sample and hold circuits have been demonstrated on both silicon and GaAs substrates at sample rates higher than 1 giga-sample/second, such as discussed by K. Poulton et al., in their article entitled "A 2 GHz HBT Sample and Hold" *GaAs IC Symposium*, pp. 199-202, 1988, and by K. Poulton et al., in their article entitled "A 1-GHz 6-bit ADC System," *IEEE J. Solid-State Circuits*, Vol. SC-22, pp. 962-970, 1987. The circuits of these two publications have the potential of array integration and integration with other electronic signal processing circuits. However, they are subject to the problems associated with timing jitter and other difficulties, especially at high sampling rates.

On the other hand, optical circuits have been regarded as advantageous in terms of realizing very high speed and parallelism. Presently, an all-optical sample and hold circuit has not been achieved as efficient three-terminal active optical devices are still being developed. Instead, optoelectronic sample and hold circuits using optical devices for signal switching and electronic devices for signal processing have been widely studied, such as those referred to in the articles by D. H. Auston entitled "Picosecond Optoelectronic Switching and Gating in Silicon," *Appl. Phys. Lett.*, Vol. 26, pp. 101-103, 1975, F. J. Leonberger et al. in the article entitled "High-Speed InP Optoelectronic Switch," *Appl. Phys. Lett.*, Vol. 35, No. 9, pp. 712-714, 1979, and the article by I. Yao et al. entitled "High-Speed Optoelectronic Track-and-Hold Circuits in Hybrid Signal Processors for Wideband Radar," *Picosecond Electronics and Optoelectronics, Proceedings of the Topical Meeting*, Lake Tahoe, Springer-Verlag Series in Electrophysics 21, pp. 207-211, 1985, and the article by E. A. Chauchard et al. entitled "Repetitive Semiconductor Opening Switch and Application to Short Pulse Generation," *Laser and Particle Beams*, Vol. 7, Part 3, pp. 615-626, 1989.

A typical example of an optoelectronic (OE) sample and hold circuit is shown with its functional schematic in FIG. 1 as a conventional direct OE sample and hold circuit 10. This general type of circuit was proposed for wideband radar signal processors by I. Yao et al. in their article mentioned above, and was noted for its simplicity. Laser pulses 11 are utilized to activate an OE switch 12 into the on (or closed) state at position 13. However, this circuit has several major drawbacks. First, with the switch in the ON state, the hold capacitor, $C_h(15)$, is charged directly by an input signal, $V_{in}$, from source 16 which can be quite small. Second, the time required to turn off (or open) the EO switch 12 at position 14 depends on the charge recombination, transport and photoconductive gain mechanism. Thirdly, it is typically difficult to achieve suitably low $\overline{R}_{on}$ and high $\overline{R}_{off}$ for adequate precision at high sample rates. Moreover, the operation of this circuit is limited by a reduction in the extinction ratio of laser pulse 11 at high repetition rates. The limitations of this conventional OE circuit, particularly with respect to the circuit of this invention, will be discussed in detail below.

Similar difficulties also have been encountered in the development of an all-electronic sample and hold circuits. A popular solution is to use the concept of a Wheatstone Bridge to differentiate between the on and off states. The optoelectronic approach becomes advantageous when the sample and hold sequence in this electronic switch type (bridge) circuit is controlled by activating OE switches with laser pulses. This OE bridge-type sample and hold circuit provides more charging capabilities than corresponding direct OE circuits. The periodicity of the laser pulses can be accurate to within the subpicosecond range as discussed by A. J. Taylor et al., in their article entitled "Timing Jitter in Mode-Locked and Gain Switched InGaAsP Injection Lasers," *Appl. Phys. Lett.*, Vol. 49, pp. 681-683, 1986. Good timing control of the laser pulses can be achieved using optical fiber delay lines formed by cleaving and wet etching, see the article by D. J. Albares et al., entitled "Optoelectronics Time Division Multiplexing," *Electronics Letters*, Vol. 23, pp. 327-328, 1987.

Thus, a continuing need exists in the state of the art for a new bridge-type OE sample and hold circuit based upon current steering using EO switches, such as can be fabricated on a semi-insulating (Fe doped) InP substrate. Such EO bridge type sample and hold circuitry offers high charging capability, commanding signal isolation, and reduced time jitter.

SUMMARY OF THE INVENTION

The present invention is directed to providing a bridge-type OE sample and hold circuit based on current steering for sampling a high-speed input signal $V_{in}$ or $V_i$ at a predetermined sample-and-hold cycle rate to assure high charging capability, commanding signal isolation, and reduced time jitter. A charging capacitor capable of being charged to a holding potential $V_h$ is connected to a diode bridge which is connected to receive the high-speed input signal $V_{in}$. A laser emits optical pulses at the predetermined sample and hold rate to a means optically coupled to receive the optical pulses for providing sample pulses and a means optically coupled to receive the optical pulses for providing hold pulses each of which are delayed from the preceding one of the sample pulses for a sample-and-track period of the sample-and-hold cycle. A bias potential source V having a magnitude greater than the high-speed input signal $V_{in}$ is connected to a first pair and a second pair of OE switches. The first pair of OE switches also is optically coupled to receive said sample pulses from the sample pulse providing means to initiate the activation (turn on) of the diode bridge for the sample-and-track period to assure the steering of charging current from the bias potential source V to the holding capacitor $C_h$ until $V_h = V_{in}$, and the second pair of OE switches also is optically coupled to receive the hold pulses from the hold pulse providing means to terminate (turn off) the activation of the diode bridge at the end of the sample-and-track period and begin a hold period of the sample-and-hold cycle.

A prime object of the invention is to provide an improved bridge-type sample and hold circuit.

Another object is to provide an optoelectronic sample and hold circuit that improves the performance of analog to digital converters by reducing the electronic noise environment, improving the electronic isolation and by reducing timing pulse jitter or aperture uncertainty in the sample/track and hold process.

Another object is to provide an optically controlled signal sampling/tracking circuitry providing for more precise optical timing pulses.

Yet another object is to provide an optoelectronic sample and hold technique that reduces pedestal/offset error and reduces the electronic noise environment in digitizing systems.

Still another object is to provide an optoelectronic switching sample and hold having a faster response time than contemporary circuits.

Another object is to provide an optoelectronic switching sample and hold circuit designed to reduce hold capacitor charge leakage.

These and other objects of the invention will become more readily apparent from the ensuing specification and claims when taken in consideration with the accompanying drawings.

DESCRIPTION OF THE PREFERRED EMBODIMENT

Figure 2:
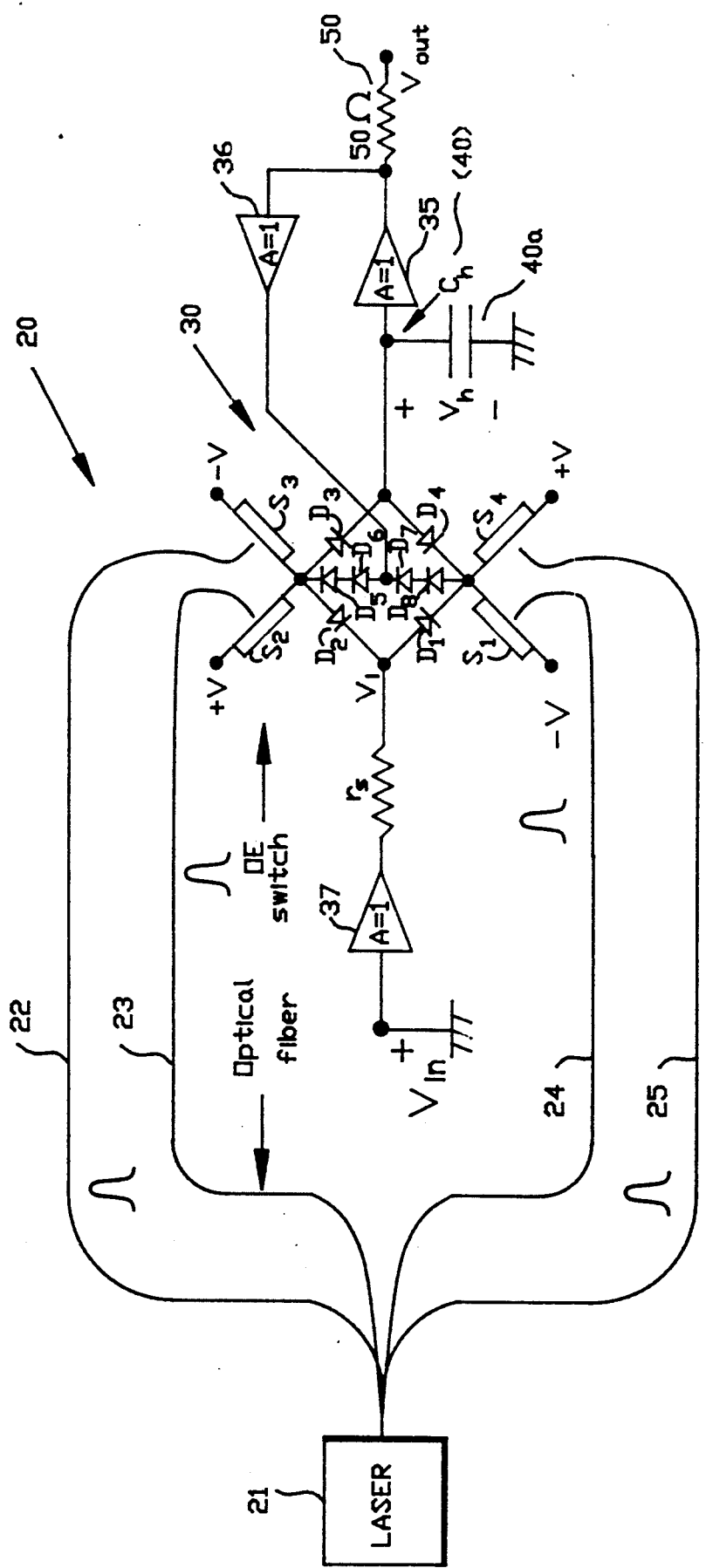
FIG. 2 depicts a functional schematic of a bridge-type OE sample and hold circuit consisting of a Schottky diode bridge and four optoelectronic switches (biased at voltage V that is much larger than voltage $V_{in}$) fabricated in accordance with this inventive concept. The bridge is turned on (defining the track or sample period) by illuminating OE switches $S_1$ and $S_2$ simultaneously (while switches $S_3$ and $S_4$ are open) and is turned off (defining the hold period) by illuminating OE switches $S_3$ and $S_4$ (while switches $S_1$ and $S_2$ are off [open]). The two unit-gain amplifiers 35 and 36 are used to minimize the pedestal in the hold voltage.

Referring now to FIG. 2 of the drawings, a bridge-type optoelectronic sample and hold circuit 20 is depicted which depends on laser pulses emitted from a laser 21 over four optical fibers 22, 23, 24, 25 for timing the sample and hold sequence. The optical fibers are optically coupled to feed the pulses to four optoelectronic switches $S_1$, $S_2$, $S_3$, and $S_4$ and control on and off states of a Schottky diode bridge 30 made up of eight appropriately interconnected Schottky diodes $D_1$, $D_2$, $D_3$, $D_4$, $D_5$, $D_6$, $D_7$ and $D_8$. The Schottky diodes can have a zero-bias junction capacitance of approximately 1.2 pF and a dynamic forward resistance of approximately 15 ohms and are commercially available.

The optoelectronic switches $S_1$, $S_2$, $S_3$ and $S_4$ can be interdigitated metal semiconductor metal (MSM) structures fabricated on a semi-insulating (Fe-doped) InP substrate with annealed ohmic contacts. Each MSM switch structure can have a device area of 50-by-50 $\mu m^2$, a 2$\mu m$ electrode spacing and a 2 $\mu m$ electrode width.

Three unit gain amplifiers 35, 36, 37, each having a 350-MHz bandwidth can be used for feedback and buffering. A hold capacitance $C_h$ (40) can be rated at approximately 20 pF and can consist of the input capacitance of buffer amplifier 35 (5 pF) and a ceramic capacitor 40a of 15 pF.

Since the enumerated optical and electronic components, as well as others indicated in FIG. 2, are assembled on a PC board, parasitic capacitance, impedance mismatch and electrical delays of the PC board allow the described embodiment to work well at only a maximum sample rate of 20 MHz. Obviously, to one skilled in this particular art, other sample rates could be employed when the selection of components is different in a manner which will suggest itself from a reading and understanding herein to one skilled in this art.

Figure 3A:
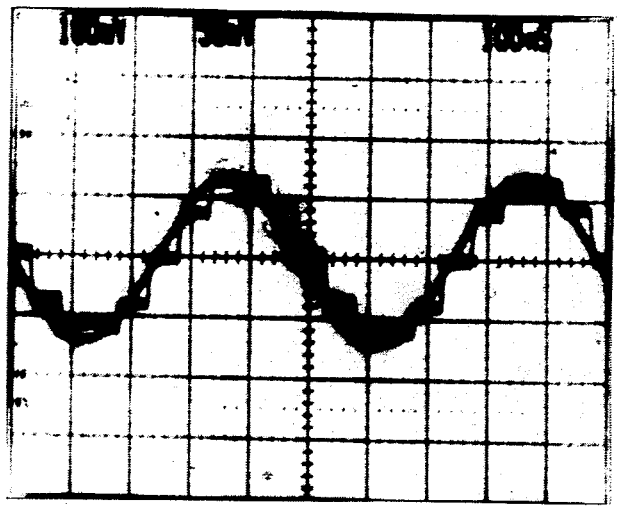
FIG. 3(a) shows a result of the bridge-type OE sample and hold circuit of FIG. 2 with a 2-MHz sine wave sampled at 20 MHz, the sample and hold output together with the input signal.
Figure 3B:
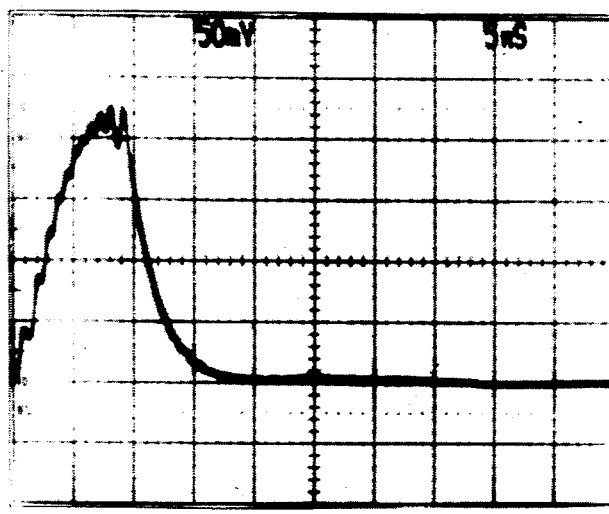
FIG. 3(b) shows the pulse response of the OE switches of the bridge-type OE sample and hold circuit of FIG. 2 with a 6 V bias.
Figure 3C:
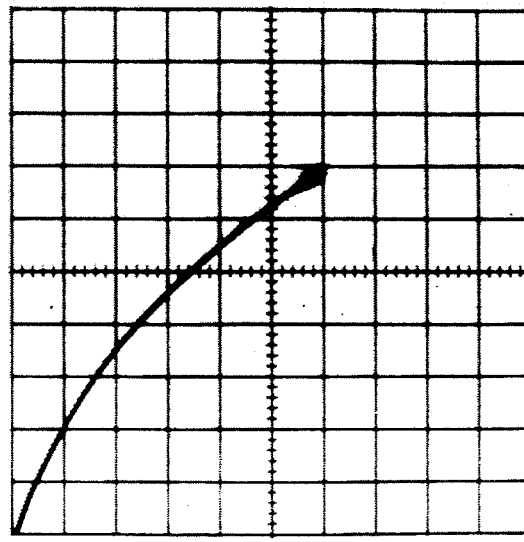
FIG. 3(c) shows the I-V curve of the OE switch under optical pulse activation; the horizontal scale is 1 V/div and the vertical scale is 0.1 mA/div.

Referring now to FIG. 3a, both input signal $V_{in}$ or $V_i$ and output signal $V_{out}$ are displayed under optical pulse excitations. The optoelectronic switches are activated by a train of closely spaced (in time) optical pulses coming from laser 22 which might be a GaAs/AlGaAs laser. The duration of the pulse train is 8 ns and it is produced at a 20 MHz repetition frequency. The pulse spacing within each 8 ns train is approximately 1 ns and each constituent optical pulse has a FWHM much less than 1 ns. Since the pulses are too rapid for the OE switches to effectively resolve individually, the pulse trains represent a more or less functionally continuous 8 ns long square pulse. The combined pulse on each switch has a measured optical energy of approximately 8 pJ. The corresponding increase in conductance of the switches by the combined pulses in each pulse train enables the hold capacitance $C_h$(40) of 20 pF to be rapidly charged up (or discharged) by current steering via the diode bridge and OE switches. FIGS. 3(b) and 3(c) respectively show the optical pulse response of an OE switch at 6 V bias and the corresponding I-V characteristic (displayed on an oscilloscope with a 50 Ω input impedance 50).

The basic operation of OE bridge-type circuit 20 is more thoroughly understood from the following more detailed analysis. During a sample and track period of a sample and hold cycle, OE switches $S_1$ and $S_2$ are turned on (that is, they are closed) by laser pulses (sample-and-hold initiation pulses or sample command) coming from laser 21 via optical fibers 24 and 23, respectively. OE switches $S_3$ and $S_4$ are off or open at this time. If the hold capacitor voltage $V_h$ is larger than the signal voltage $V_{in}$, then diodes $D_2$ and $D_4$ respectively are more conductive than diodes $D_1$ and $D_3$. The difference between conductive currents of $D_4$ and $D_3$ discharges $C_h$ (40) and thereby reduces $V_h$. If $V_h$ is smaller than $V_{in}$, then diodes $D_1$ and $D_3$ respectively are more conductive than diodes $D_2$ and $D_4$. The difference between conductive currents of $D_3$ and $D_4$ charges holding capacitor $C_h$ (40) and increases $V_h$. The charging or discharging process continues within the sample and track period and stops when $V_h$ equals $V_{in}$. During the hold period of the sample and hold cycle, diodes $D_1$, $D_2$, $D_3$ and $D_4$ are reversed bias to isolate $V_h$ from $V_{in}$. This is accomplished by turning on (closing) the OE switches $S_3$ and $S_4$ with the delayed laser pulses (sample-and-hold termination pulses or the hold command) via the pulses appearing over optical fibers 22 and 25, respectively. At this time OE switches $S_1$ and $S_2$ return to an off or open state as the sample or track optical pulse has now passed The turning on of $S_3$ and $S_4$ causes diodes $D_5$, $D_6$, $D_7$ and $D_8$ to be forward biased which clamps the reverse bias voltage of diodes $D_1$, $D_2$, $D_3$ and $D_4$. Both sample and hold commands originate from a single laser pulse from laser 21 which is power divided and coupled into four fiber optic delay lines 22, 23, 24 and 25. The four fiber delay links are cut in the proper lengths for simultaneous activation of OE switches $S_1$ and $S_2$ as well as for the simultaneous activation of OE switches $S_3$ and $S_4$ at a later time.

Figure 4A:
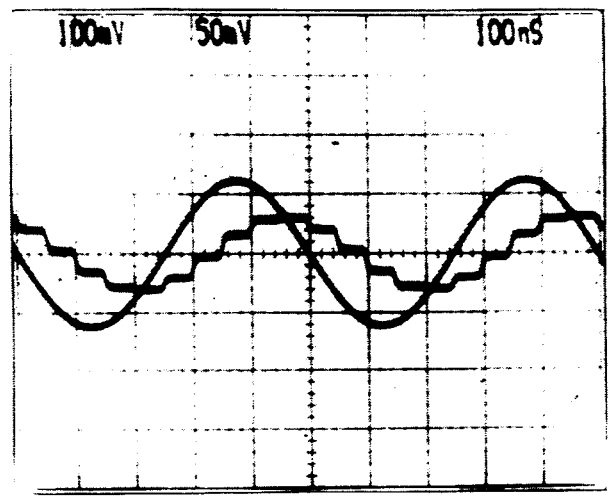
FIG. 4(a) is a result of a conventional direct OE sample and hold of FIG. 1 with a 2-MHz sine wave sampled at 20 MHz, the sample and hold output together with the input signal.
Figure 4B:
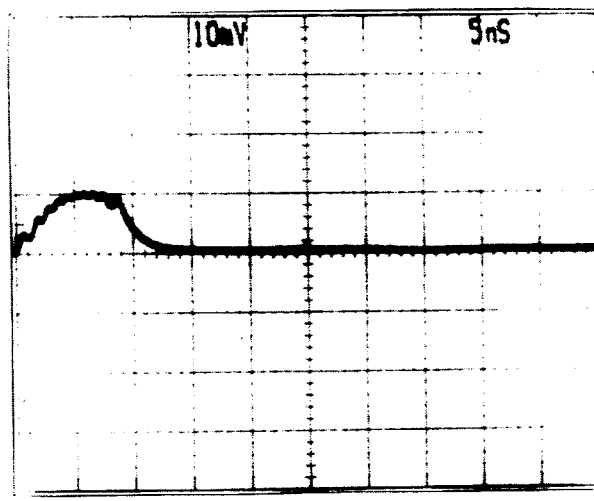
FIG. 4(b) shows the pulse response of the OE switch at 0.2 V bias for the conventional direct OE sample and hold of FIG. 1.
Figure 4C:
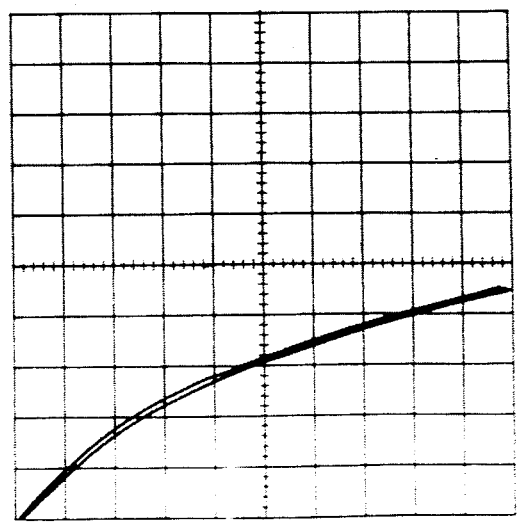
FIG. 4(c) shows the I-V curve of the OE switch under optical pulse activation for the conventional direct OE sample and hold of FIG. 1.; the horizontal scale is 0.1 V/div and the vertical scale is 0.02 ma/div.

A comparison of the results depicted in FIGS. 3(a), 3(b) and 3(c) of the optoelectronic bridge circuit 20 to the results depicted in FIGS. 4(a), 4(b) and 4(c) of the prior art, direct OE sample and hold circuit 10, makes apparent the improved operation of the invention. The same circuit components used to generate the waveforms of FIGS. 3(a), 3(b) and 3(c) (such as hold capacitor $C_h$, the OE switch 13 [as compared to each of the switches $S_1$, $S_2$, $S_3$ and $S_4$] and the unit gain amplifier of circuit 10 and each of amplifiers 35, 36 and 37 of circuit 20) have been used in the embodiment of FIG. 2 as well as in the prior art embodiment of FIG. 1. In addition, the laser pulse actuation level 11 in FIG. 1 and pulses coming from laser 21 in FIG. 2 have been kept the same.

Figure 1:
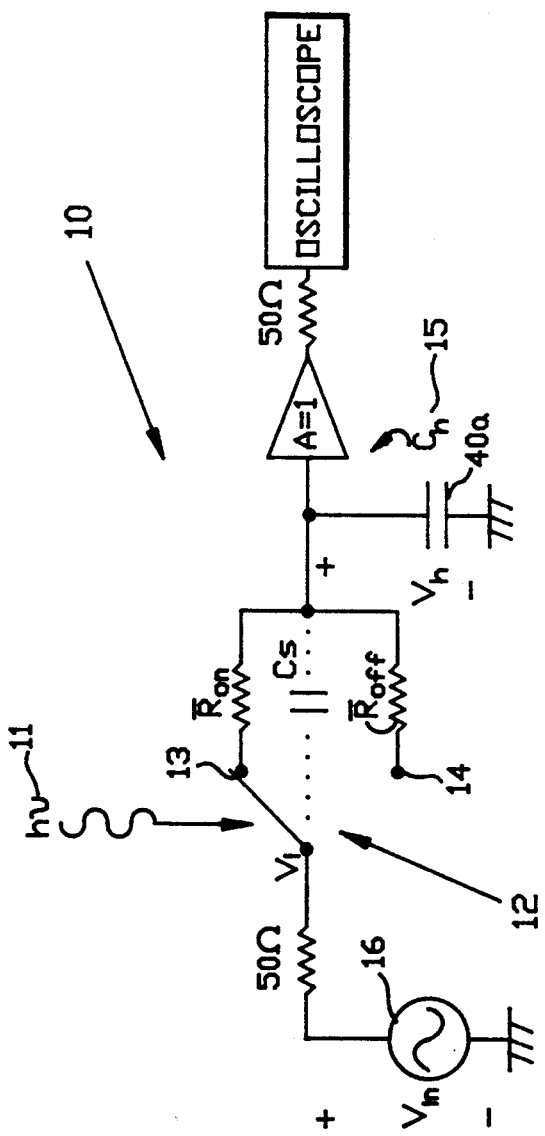
FIG. 1 is a functional schematic of a prior art conventional direct OE sample and hold circuit. The photoconductor is modeled as a switch capacitor $C_s$ in parallel with a resistor. This resistor has an average resistance $R_{on}$ during the switch on-time and has an average resistance $R_{off}$ during the switch off-time.

FIG. 4(a) shows the sample and hold output together with the 2-MHz input sine wave when the switch 12 in FIG. 1 is under optical pulse excitation 11. A phase lag of approximately 60° is observed between the input sine wave $V_{in}$ and the output as a result of the inability of this direct OE circuit of FIG. 1 to adequately charge up the hold capacitor $C_h$ from the input signal. FIG. 4(b) and FIG. 4(c) respectively show the optical pulse response of the switch at a 0.2 V bias and the corresponding I-V characteristics.

Noting the waveforms of FIG. 3(a), bridge-type OE sample and hold circuit 20 of FIG. 2 is capable of adequately charging hold capacitance $C_h$ (40) of 20 pF. Consequently, no measurable phase difference is observed between the 2-MHz input sine wave and the sample and hold output. Because the oscilloscope input impedances for the input and output signals are 1 MΩ and 50 Ω, respectively, the displayed output amplitude is only half of the input amplitude. From the switch response shown in FIG. 3(b), the average on-resistance $\overline{R}_{on}$ is estimated to be 2.8 KΩ over an average time interval of approximately 14 ns and the average off-resistance $\overline{R}_{off}$ is 150 KΩ over approximately 36 ns. The replacement of OE switches $S_3$ and $S_4$ by 2-20 KΩ resistors may be an appropriate designed selection for some applications since the $\overline{R}_{on}$ of switches $S_1$ and $S_2$ is much less than the 20 KΩ and $\overline{R}_{off}$ is much larger than the 20 KΩ.

The circuit performance clearly will be improved with actual OE switches at $S_3$ and $S_4$. The maximum charge available for charging up to the hold capacitor $C_h$ (40) is $3.7 \times 10^{-11}$ coulombs as estimated from the area under the pulse response shown in FIG. 3(b). This is equivalent to charging up $C_h$ (40) to a maximum voltage of 1.8 V which is much larger than the input voltage amplitude to 0.12 V. Thus, with the OE switch bias at 6 V rather than at the signal voltage of 0.12 V, the OE switch can fully charge up the hold capacitor.

In contrast, the direct OE sample and hold circuit 10 of FIG. 1 can only charge up to 50% of the input signal, [as shown in FIG. 4(a)]. In addition, the phase lag of 60° between the output and the input makes it difficult to sample and hold non-sinusoidal inputs.

The inability of the direct OE sample and hold circuit of FIG. 1 to adequately charge a 20 pF value of $C_h$ and the resultant phase lag in the output can be more readily understood from the following analysis. The switch response depicted in FIG. 4(b) has an $\overline{R}_{on}$ of 1.5 KΩ over a time interval of approximately 12 ns and an $\overline{R}_{off}$ of 57 KΩ over approximately 38 ns. The switch conductance average over 50 ns gives an average resistance $\overline{R}$ of 5.8 KΩ. With $\overline{R}$ in series with $C_h$, the envelope of hold voltage $V_h$ across $C_h$ is related to $V_{in}$ in FIG. 1 as:

$$\frac{V_h}{V_i} = \frac{1}{\sqrt{1 + (2\pi fRC_h)^2}} \exp[-j \tan^{-1}(2\pi fRC_h)] = 0.56 \, e^{-j65°} \quad (1)$$

where f is the input signal frequency of 2 MHz. The result of equation (1) is comparable to the measured value of $0.50 \, e^{-j60°}$. The switch is assumed to be resistor-like when the signal $V_{in}$ is less than 0.12 V. This is consistent with the I-V characteristic shown in FIG. 4(c).

At a bias of less than 0.12 V (which corresponds to an electric field $\leq 600$ V/cm), the carrier velocity has not reached the saturated value. Thus, the InP switch used in the conventional direct OE sample and hold circuit 10 of FIG. 1 functions as a photoconductor with the output current proportional to the voltage. However, the same InP switch used in the bridge-type circuit 20 of FIG. 2 at a bias of 6 V behaves somewhat between a photoconductor and a p-i-n photodiode exhibiting the characteristics as depicted in FIG. 3(c), where the output current depends on both optical power and the bias voltage since the switch response involves a sweepout of photogenerated carriers at the saturation velocity (as for p-i-n photodiodes) and an increase in the conductance due to carrier injection at the contacts (as for photoconductors). Further insight regarding this phenomenon may be had by consulting the article by S. J. Wojtczuk et al. "Comparative Study of Easily Integratable Photodetectors," *J. Lightwave Technology*, Vol. LT-5, No. 10, pp. 1365-1370, 1987.

The enhanced charging capability of bridge type sample and hold circuit 20 of this invention, upon further analysis, reveals that during the sample and track period, OE switches $S_1$ and $S_2$ are simultaneously activated by identical optical pulses. Using Kirchhoff's current law and the current-voltage relationship of junction diodes, the charging current $I_c$ of the hold capacitor $C_h$ (40) is expressed in terms of the OE switch current $I_{sw}$ and the voltage difference $V_{in} - V_h$ as $$I_c = I_{sw} \tanh[q(V_i - V_h)/2nkT] \quad (2)$$

where n is the ideal factor of the diode, T equals the ambient temperature, q is the electronic charge and k is Boltzman's constant. Further understanding of this phenomenon may be had by consulting the article by J. R. Gray et al. entitled "A Precision Sample and Hold Circuit with Sub Nanosecond Switching," *IEEE Transactions Circuit Theory*, Vol. CT-11, pp. 389–396, 1964. With the absolute value of the quantity $V_{in} - V_h$ being much greater than $2nkT/q$ in the sample period, the OE switch current $I_{sw}$ is completely steered to or from hold capacitor $C_h$ (40) (that is, the absolute value of $I_c = I_{sw}$). When the absolute value of $V_{in} - V_h$ is much, much less than $2nkT/q$, the four bridge diodes $D_1$, $D_2$, $D_3$ and $D_4$ are approximately equally biased with the output voltage ($V_{out}$ in FIG. 2) tracking the input signal voltage $V_{in}$. The current passing through each bridge diode is $I_{sw}/2$ and $I_c$ in equation (2) can be approximated by $(V_{in} - V_h)/r_d$, where $r_d$ is the incremental diode resistance at a forward current at $I_{sw}/2$.

Figure 5:
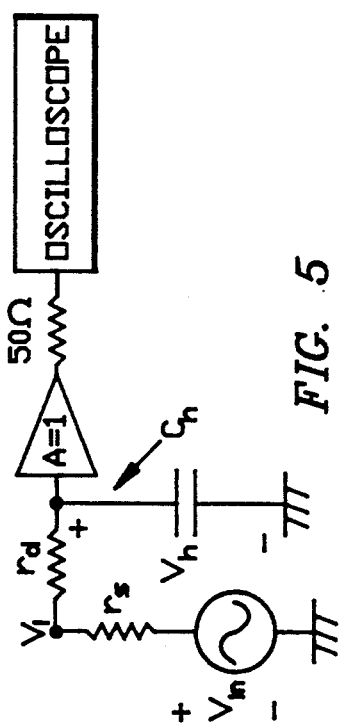
FIG. 5 is a small-signal equivalent circuit of the bridge type circuit in the track state. $r_d$ is the incremental diode resistance at a forward current of $I_{sw}/2$ and $r_s$ is the amplifier output resistance.

The equivalent circuit of the OE bridge type sample and hold circuit 20 can be modeled as depicted in FIG. 5, see the above referenced article by R. Grey et al. The combined resistance of the diode incremental resistance (15 Ω) and the source buffer amplifier output resistance (<10 Ω) is less than 25 Ω, which is still much less than the switch on resistance (1.4 KΩ) in the conventional direct OE sample and hold circuit 10 depicted in FIG. 1. This implies that the bridge-type OE circuit 20 of FIG. 2 can sample and track the input signal while the conventional direct OE circuit 10 of FIG. 1 cannot.

With $V_{in} = V_h = 0$, the bridge-type OE sample and hold circuit 20 of FIG. 2 is symmetrically balanced and no pedestal in the hold voltage is expected. This is because the voltage drops across diodes $D_1$, $D_2$, $D_3$ and $D_4$ are the same provided that "identical" Schottky diodes and "identical" OE switches are used.

With nonzero $V_h$, diode bridge 30 is no longer symmetrically balanced and the output voltage drops across $D_3$ and $D_4$ may be different. A pedestal in the hold voltage during the transition of bridge diodes from the on to off state can occur. This is a result of charging or discharging capacitor $C_h$ (40) by the current $(I_3 - I_4)$, where $I_3$ and $I_4$ are on-to-off transient currents passing through diodes $D_3$ and $D_4$, respectively. $D_3$ and $D_4$ will be equally reverse biased by the forward biased clamping diodes $D_5$, $D_6$, $D_7$ and $D_8$ in the hold period. Equal amounts of stored excess carriers then are swept out of diodes $D_3$ and $D_4$ when the bridge diodes turn from an equally forward biasing condition in the track period to the equally reverse biasing condition in the hold period. Thus, pedestal can be minimized by the feedback amplifier 36 connected between hold capacitor $C_h$ and the clamping diodes $D_5$, $D_6$, $D_7$ and $D_8$, as shown in FIG. 2, (see the above referenced "A 1 GHz . . ." article by K. Poulton et al.), provided that the time delay through feedback amplifier 36 is small compared to the on-to-off transient time. The off-to-on transient of the bridge diodes is not as important as the pedestal problem associated with the on-to-off transient, since it only delays the starting time of the track period.

The bridge-type OE sample and hold 20 operates properly at 20 MHz with a diode capacitance $C_j$ of 1.2 pF and a $C_h$ (40) of 20 pF. If these capacitances are reduced by a factor of 100 such as in an integrated bridge circuit with fast OE switches, the resultant sample and hold circuit is expected to work at 2 GHz. This last instance compares to the bridge type electronic sample and hold operating at 2 GHz with a $C_j$ of 12 fF and a $C_h$ of 200 fF (see the above referenced "A 2 GHz . . ." article by K. Poulton et al.).

The OE diode-bridge sample and hold circuit 20 of FIG. 2 has the following potential advantages. First of all, in comparison with the direct OE circuit 10 of FIG. 1, the charging capacity of this circuit is much improved since the OE switches $S_1$, $S_2$, $S_3$ and $S_4$ are biased at a fixed high voltage $+V$, $-V$. Thus, the charging capacity of the OE diode-bridge sample and hold circuit 20 is capable of charging up the hold capacitance $C_h$ (40) with improved speed and precision. Secondly, the off-state feed through of the switch will not appreciably degrade the performance of bridge circuit 20 as compared with the direct OE circuit 10 of FIG. 1 and that of all-electronic methods. This is due to the fact that the on and off states of the diode bridge 30 are determined by relative conductances $G_1$, $G_2$, $G_3$ and $G_4$, respectively associated with OE switches $S_1$, $S_2$, $S_3$ and $S_4$. During the sample and track period when $G_2$ is greater than $G_3$, and $G_1$ is greater than $G_4$, diode bridge 30 is forward biased and the current difference between OE switches $S_2$ and $S_3$ (or between $S_1$ and $S_4$) is steered by the signal to charge (or discharge) the hold capacitor $C_h$ (40). The amount of current available for steering depends only upon OE switch $S_2$ being more conductive than OE switch $S_3$, as well as OE switch $S_1$ being more conductive than OE switch $S_4$. During the hold period, $V_h$ is isolated from $V_{in}$ by reverse biased diodes $D_1$, $D_2$, $D_3$ and $D_4$. The reverse biasing of these diodes again depends upon the relative conductance of the four OE switches, $S_1$, $S_2$, $S_3$ and $S_4$ with their conductances such that $G_2$ is less than $G_3$ and $G_1$ is less than $G_4$. Consequently, OE bridge-type sample and hold 20 is less dependent on the charge recombination, the photoconductive gain mechanisms, the linearity of the optoelectronic switches, and the extinction ratio of the laser pulse from laser 21.

The potential advantages of bridge type OE sample and hold 20 of FIG. 2 over the conventional electronic sample and hold circuit 10 stem from the use of OE switches activated by a single laser pulse from a laser 21 that is distributed over four fiber-optic delay lines 22, 23, 24, 25. This results in total electrical isolation between commanding optical pulses and the output from the sample and hold circuit, precise timing control, and potentially stable pulses of less time jitter (<1 ps for OE versus 2.5 ps for electronic sample and hold). (These figures are arrived at from the articles by A. J. Taylor et al., entitled "Timing Jitter in Mode-Locked and Gain Switched InGaAsP Injection Lasers," *Appl. Phys. Lett.*, Vol. 49, pp. 681–683, 1986, and K. Poulton et al., in their article entitled "A 1-GHz 6-bit ADC System," *IEEE Journal Solid State Circuits*, Vol. SC-22, pp. 962–970, 1987, respectively. The first feature is the direct result of zero input capacitance with respect to activating optical pulses. The stability of the laser pulses enables the OE switch to meet the strict requirement for high timing accuracy needed to sample and hold the high frequency signal with considerable precision.

Besides the timing accuracy, the bridge-type OE sample and hold circuit 20 of FIG. 2 easily combines the current source and switch in a single OE device. This reduces the complexity of fabricating the sample and hold circuit since the OE switch can have an active area larger than the emitter area of a bipolar transistor (for example, $2.2 \times 2.2$ $\mu m^2$ in the HBT), the charging capability of the OE sample and hold in principle can be superior to that of the electronic sample and hold.

Obviously, many modifications and variations of the present invention are possible in the light of the above teachings. It is therefore to be understood that within the scope of the appended claims, the invention may be practiced otherwise than as specifically described.

I claim:

1. A bridge-type OE sample and hold circuit based on current steering for sampling a high-speed input signal $V_{in}$ at a predetermined sample-and-hold cycle rate to assure high charging capability, commanding signal isolation, and reduced time jitter comprising:

means for charging to a holding potential $V_h$;

a diode bridge connected to the charging means and connected to receive said high-speed input signal $V_{in}$;

a bias potential source V having a magnitude greater than said high-speed input signal $V_{in}$;

a source of optical pulses emitted at said predetermined sample and hold rate;

means optically coupled to receive said optical pulses for providing sample pulses;

means optically coupled to receive said optical pulses for providing hold pulses each of which are delayed from the preceding one of said sample pulses for a sample-and-track period of said sample-and-hold cycle; and a first pair and a second pair of OE switches, said first pair of OE switches being connected to said bias potential source V and optically coupled to receive said sample pulses from the sample pulse providing means to initiate the activation (turn on) of said diode bridge for said sample-and-track period to assure the steering of charging current from said bias potential source V to said charging means until $V_h = V_{in}$, and said second pair of OE switches being connected to said bias potential source V and optically coupled to receive said hold pulses from the hold pulse providing means to terminate (turn off) the activation of said diode bridge at the end of said sample-and-track period and begin a hold period of said sample-and-hold cycle.

2. An apparatus according to claim 1 in which said sample pulse providing means and said hold pulse providing means are a first pair of equally lengthened optical waveguides each coupled to a separate one of said first pair of said OE switches and a second pair of equally lengthened optical waveguides of a different length then said first pair of equally lengthened optical waveguides, each optically coupled to a separate one of said second pair of OE switches.

3. An apparatus according to claim 2 in which said charging means is a holding capacitor chargeable by said charging current to said holding potential $V_h$; and said source of optical pulses is a single laser pulse source.

4. An apparatus according to claim 3 in which said diode bridge includes forward biased clamping diodes connected thereacross and further includes:

a feedback amplifier coupled between said holding capacitor and said forward biased clamping diodes for sweeping accumulated charge therefrom to minimize a pedestal condition in the hold of said $V_h$ accumulated in said holding capacitor and assure said predetermined sample-and-hold cycle rate.

5. A circuit according to claim 4 in which the use of said OE switches activated by said single laser pulse source distributing laser pulses over four fiber optic delay lines results in total electrical isolation between commanding optical pulses from said laser pulse source and the output from said diode bridge to thereby assure precise timing control, and potential stable pulses with reduced time jitter since there is zero input capacitance with respect to the activating optical said laser pulses and the stability of said laser pulses enables said OE switches to provide for high timing accuracy with needed precision to sample and hold said high-speed input signal $V_{in}$.

6. A circuit according to claim 4 in which said housing capacitor is held at a charging potential $V_h$ by the OE actuated diode bridge to assure a reduced charge leakage, commanding signal isolation, fabrication simplicity, accurate timing control and reduced time jitter.

* * * * *